(12) United States Patent
Chen et al.

(10) Patent No.: US 10,741,749 B2
(45) Date of Patent: Aug. 11, 2020

(54) SPIN ORBIT TORQUE-BASED SPINTRONIC DEVICES USING $L1_0$-ORDERED ALLOYS

(71) Applicant: National University of Singapore, Singapore (SG)

(72) Inventors: Jingsheng Chen, Singapore (SG); Liang Liu, Singapore (SG); Jinyu Deng, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 16/107,531

(22) Filed: Aug. 21, 2018

(65) Prior Publication Data

US 2019/0058112 A1    Feb. 21, 2019

(30) Foreign Application Priority Data

Aug. 21, 2017    (SG) .......................... 10201706806R (51) Int. Cl.
| | |
|---|---|
| *H01L 43/08* | (2006.01) |
| *H01L 43/10* | (2006.01) |
| *H01L 27/22* | (2006.01) |
| *G11C 11/16* | (2006.01) |
| *H01L 43/02* | (2006.01) |

(Continued)

(52) U.S. Cl.
CPC ............ *H01L 43/08* (2013.01); *G11C 11/161* (2013.01); *G11C 11/1675* (2013.01); *G11C 11/18* (2013.01); *H01L 27/222* (2013.01); *H01L 43/02* (2013.01); *H01L 43/10* (2013.01); *G11B 5/1278* (2013.01)

(58) Field of Classification Search
None
See application file for complete search history.

(56) References Cited

U.S. PATENT DOCUMENTS

| | | | |
|---|---|---|---|
| 9,595,282 | B2 | 3/2017 | Sayama et al. |
| 2018/0040357 | A1* | 2/2018 | Shirotori ............. G11C 11/1675 |

FOREIGN PATENT DOCUMENTS

| | | |
|---|---|---|
| CN | 102864424 A | 1/2013 |
| CN | 103440875 A | 12/2013 |
| SG | 172495 A1 | 7/2011 |

OTHER PUBLICATIONS

Kohn, Amit, et al., "Structure of Epitaxial $L1_0$-FePt/MgO Perpendicular Magnetic Tunnel Junctions," American Institute of Physics, Applied Physics Letters, vol. 102, Feb. 11, 2013, pp. 1-5.

(Continued)

*Primary Examiner* — Jay C Chang
(74) *Attorney, Agent, or Firm* — Cesari and McKenna, LLP; James A. Blanchette (57) ABSTRACT

In one embodiment, a SOT device provides current-induced perpendicular magnetization switching in a single magnetic layer, such as a $L1_0$-ordered magnetic alloy layer of FePt alloy, CoPt alloy, FePd alloy or another atomically layered magnetic alloy. The SOT may originate from the large spin orbit coupling in these alloys. Depending on the implementation, the SOT device may take the form of a SOT-MRAM, a spin memristor, a current-assisted magnetic recording media, or other type of device.

15 Claims, 11 Drawing Sheets

(51) Int. Cl.
    *G11C 11/18*     (2006.01)
    *G11B 5/127*     (2006.01)

(56) References Cited

OTHER PUBLICATIONS

Ohtake, Mitsuru, et al., "$L1_0$ Ordered Phase Formation in FePt, FePd, CoPt, and CoPd Alloy Thin Films Epitaxially Grown on MgO (001) Asingle-Crystal Substances," American Institute of Physics, Journal of Applied Physics, vol. 111, Feb. 21, 2012, pp. 1-3.

Ranjbar, Reza, et al., "Current-induced Spin-Orbit Torque Magnetization Switching in a MnGa/Pt Film with a Perpendicular Magnetic Anisotropy," The Japan Society of Applied Physics, Rapid Communication, Japanese Journal of Applied Physics, vol. 55, No. 12, Nov. 1, 2016, pp. 1-4.

Yang, G., et al., "Effect of Interfacial Structures on Spin Dependent Tunneling in Epitaxial $L1_0$-FePt/MgO/FePt Perpendicular Magnetic Tunnel Junctions," AIP Publishing LLC, Journal of Applied Physics, vol. 117, Feb. 24, 2015, pp. 1-4.

Zhang, L. et al., "$L1_0$-ordered FePtAg-C Granular Thin Film for Thermally Assisted Magnetic Recording Media (Invited)," American Institute of Physics, Journal of Applied Physics, vol. 109, No. 7, Mar. 17, 2011, pp. 1-4.

\* cited by examiner

SPIN ORBIT TORQUE-BASED SPINTRONIC DEVICES USING L1$_0$-ORDERED ALLOYS

RELATED APPLICATIONS

The present application claims priority to Singapore Patent Application No. 10201706806R, titled "Spin Orbit Torque-Based Spintronic Devices Using L1$_0$-Ordered Alloy," filed by Applicant National University of Singapore on Aug. 21, 2017, the contents of which are incorporated by reference herein in their entirety.

BACKGROUND

Technical Field

The present disclosure relates generally to spintronic devices more specifically to spin-orbit torque (SOT) based spintronic devices ("SOT devices") that include a L1$_0$-ordered alloy ferromagnet (FM) layer.

Background Information

Spintronic devices, such as spin torque magnetic random access memory (MRAM), manipulate magnetization directions to store information or for other purposes. Magnetization direction may be manipulated using spin transfer torque (STT). STT techniques have advanced over a number of years, and STT MRAM is becoming commercially available. Magnetization manipulation may also be achieved via SOT.

A typical SOT device for a memory application is structured as a device stack having a number of layers, including a spin Hall material (SHM) layer adjacent to a magnetic material (MM) layer forming a SHM/MM bilayer. The SHM layer, which has strong spin orbit coupling, can be made of a heavy metal (HM) (e.g., platinum (Pt), tantalum (Ta) tungsten (W), etc.), an antiferromagnet (AFM) (iridium manganese alloy (IrMn), platinum manganese alloy (PtMn), etc.), or a topological insulator (bismuth selenide (Bi$_2$Se$_3$), bismuth-antimony telluride (Bi, Sb)$_2$Te$_3$), etc.). The MM layer can be made of a ferromagnet (FM) (e.g., permalloy (Py), cobalt (Co), cobalt iron boron alloy (CoFeB)), a ferrimagnet (e.g., cobalt terbium (CoTb), terbium iron cobalt (TbFeCo), gadolinium iron cobalt (GdFeCo), etc.), or a magnetic insulator (e.g., thulium iron garnet (TmIG), etc.). For the above SHM/MM bilayers, the SOT responsible for magnetization switching originates from the spin Hall effect (SHE) in the SHMs. When an in-plane current is applied to the SOT device, a pure spin current generated in the SHM layer is absorbed in the MM layer to exert a torque on the magnetic moments and switch the magnetization direction thereof. For example, considering the case of a SOT device employing a Ta HM as the SHM layer and a CoFeB FM as the MM (i.e., a Ta/CoFeB bilayer as the SHM/MM bilayer), when an in-plane input current is applied, current-induced SOT from the Ta layer may switch the magnetization direction of the CoFeB layer.

In general, SHM/MM (e.g., HM/FM) bilayers are used in traditional SOT devices and the spin-torque efficiency is therefore significantly dependent on the spin current transmission transparency and spin relaxation at the interface. To avoid the interface effects and improve the spin-torque efficiency, one can realize the current-induced magnetization switching in a single layer. Certain attempts have been made to utilize a ferromagnetic semiconductor (e.g. gallium manganese arsenide (GaMnAs)) and an antiferromagnetic metal (e.g. copper manganese arsenide (CuMnAs)) to perform in-plane magnetic domain switching due to the inverse spin galvanic effect (iSGE) induced SOT. However, for SOT devices used in memory, a perpendicular magnetization switching is necessary for high-density storage.

Accordingly, there is a need for new techniques that enable SOT devices to perform perpendicular magnetization switching in a single magnetic layer.

SUMMARY

A SOT device provides current-induced perpendicular magnetization switching in a single magnetic layer, such as a L1$_0$-ordered magnetic alloy layer of iron-platinum (FePt) alloy, cobalt-platinum (CoPt) alloy, iron-palladium (FePd) alloy or other atomically layered magnetic alloy (e.g., CuAu—I-type, CsCl-type, etc.). The SOT originates from the large spin orbit coupling in these alloys. Compared with the previous HM/FM bilayers, the charge-to-spin conversion efficiency of a single L1$_0$-ordered magnetic alloy layer is several times higher. The SOT device may take a number of different forms.

In a first embodiment, the SOT device takes the form of a SOT-MRAM that utilizes current-induced SOT in a L1$_0$-ordered magnetic alloy layer to change magnetization direction. The L1$_0$-ordered magnetic alloy layer may be deposited on a single crystal substrate, such as a strontium titanate (SrTiO$_3$), magnesium oxide (MgO), lanthanum aluminum oxide (LaAlO$_3$), potassium tantalite (KTaO$_3$), titanium nitride (TiN)/MgO or glass (with chromium ruthenium (CrRu)/TiN or CrRu/MgO buffer layer) and Si substrate (with CrRu/TiN or CrRu/MgO buffer layer), to achieve perpendicular magnetocrystalline anisotropy (PMA). The perpendicular magnetization is switched between up and down by apply an in-plane current in the presence of an in-plane external magnetic current. A L1$_0$-ordered alloy single layer based SOT-MRAM may also include an AFM layer (e.g., an iridium manganese alloy (IrMn) adjacent to the L1$_0$-ordered magnetic alloy layer, which may apply a biased field through antiferromagnet exchange coupling, to permit magnetization switching in the absent of an external magnetic field. Compared to a traditional HM/FM bilayer (e.g., Ta/CoFeB bilayer) based SOT-MRAM, a L1$_0$-ordered alloy single layer based SOT-MRAM may provide higher charge-to-spin conversion efficiency, higher thermal stability, and require less fabrication processes, among other advantages.

In a second embodiment, the SOT device takes the form of a "spin memristor" that utilizes current induced SOT in a L1$_0$-ordered magnetic alloy layer to achieve multiple Hall-resistance states depending on amplitude of currents that have been previously applied. The L1$_0$-ordered magnetic alloy layer may be deposited on a single crystal substrate, such as a SrTiO$_3$, MgO, LaAlO$_3$, KTaO$_3$ or TiN/MgO substrate, or glass and Si substrate with TiN or MgO, or CrRu buffer layers, to achieve PMA. Compared to a previous memristor design that employ an AFM/FM bilayer (e.g., PtMn/[CoNi]$_N$ bilayer), a L1$_0$-ordered magnetic alloy layer based memristor may provide a more controllable domain structure and require less fabrication processes, among other advantages.

In a third embodiment, the SOT device takes the form of media in which current-assisted magnetic recording utilizes current induced SOT in L1$_0$-ordered alloy nanoparticles to assist field switching of magnetization direction. Compared to traditional HAMR (heat-assisted magnetic recording), where a laser is used to decrease the switching field, current-assisted magnetic recording, with short pulse width, may advantageously avoid heating effects, which may be harmful to the media.

It should be understood that a variety of additional features and alternative embodiments based on current-induced perpendicular switching in single magnetic layer, may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION OF EXAMPLE EMBODIMENTS

General Principles

The spin orbit torque observed in a $L1_0$-ordered alloy (e.g., FePt) layer depends strongly on its magnetic and structural properties. In order to achieve perpendicular magnetic anisotropy (PMA), a $L1_0$-ordered magnetic alloy layer (e.g., a FePt) may be deposited (e.g., epitaxially grown) on a single crystal substrate, such as a $SrTiO_3$, MgO, $LaAlO_3$, $KTaO_3$, TiN/MgO or glass and Si substrate with a buffer layer such as CrRu/TiN or CrRu/MgO, Pt or their combination.

Figure 1A:
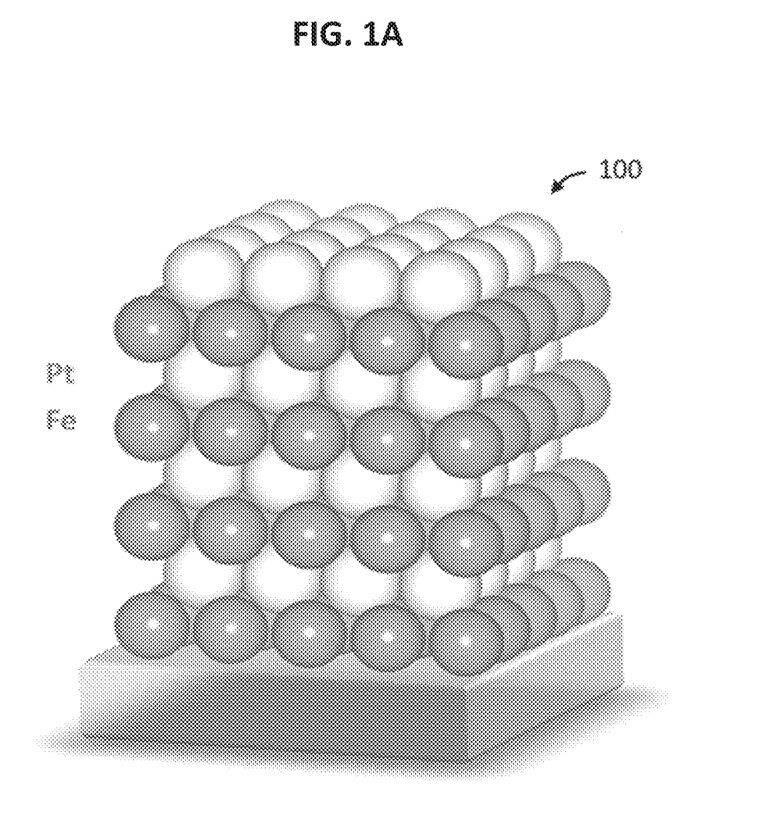
FIG. 1A is a diagram of the crystal structure of an example $L1_0$-ordered FePt alloy.

FIG. 1A is a diagram 100 of the crystal structure of an example $L1_0$-ordered FePt alloy. As shown, every two adjacent Pt atomic layers are separated by a Fe atomic layer. In traditional HM/FM bilayer for SOT-MRAM, HMs with high Z (element number) such as Pt are used because their strong spin-orbit coupling can generate large spin current. Compared with the heavy metal Pt, the 3d FM metals Fe, Co, Ni have lower Z number and weaker spin-orbit coupling. However, when a charge current flows through these FM metals, the conduction electrons with up/down spin can still get deflected to opposite sides, resulting in nonequilibrium spin accumulation. This is indeed the anomalous Hall effect (AHE) in FMs. In addition, when these FM metals are alloyed with high-Z heavy element (Pt) to form CoPt or FePt, the spin orbit coupling becomes very large, resulting in nonequilibrium spin accumulation due to AHE when an electrical current is applied. Those conduction electrons carrying spin exert a torque on the magnetic moments through exchange interaction and switch the magnetization when the SOT effect field is large enough.

Figure 1B:
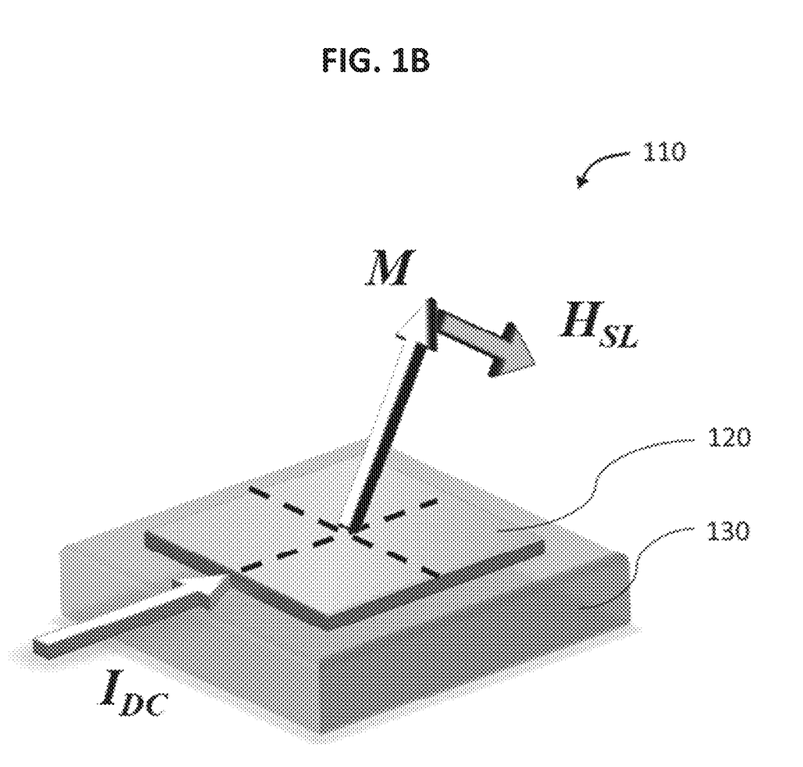
FIG. 1B is a diagram of an example $L1_0$-ordered FePt alloy layer upon a $SrTiO_3$ substrate, showing current-induced effective field due to Slonczewski-like SOT ($H_{SL}$) in the structure when a small in-plane field (not shown) is applied for tilting the perpendicular magnetization (M) by a small angle.

FIG. 1B is a diagram 110 of an example $L1_0$-ordered FePt alloy layer 120 upon a $SrTiO_3$ substrate 130, showing current-induced effective field due to Slonczewski-like SOT ($H_{SL}$). When an in-plane current $I_{DC}$ is applied in $L1_0$-ordered FePt layer, induced Slonczewski-like spin orbit torque (which behaves as effective magnetic field $H_{SL}$) is exerted on its own perpendicular magnetization M. When $I_{DC}$ is large enough, M is switched to its opposite direction (here, facing down). However, when M is facing down, an opposite effective field $-H_{SL}$ will switch M back (here, facing up). To break this symmetry, an external longitudinal field ($H_{EXT}$) can be applied. To realizing field-free switching, exchanging biased field can be imported by adding an antiferromagnetic layer (e.g., an IrMn or PtMn layer).

Figure 2A:
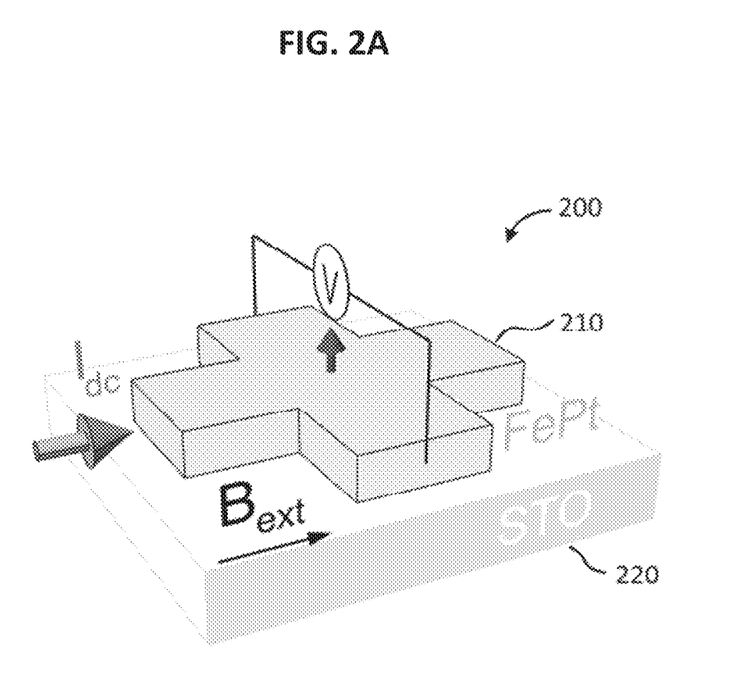
FIG. 2A is a diagram of an example structure composed of a $L1_0$-ordered FePt alloy layer (e.g., 8 nm) patterned into a Hall bar upon a $SrTiO_3$ substrate.
Figure 2B:
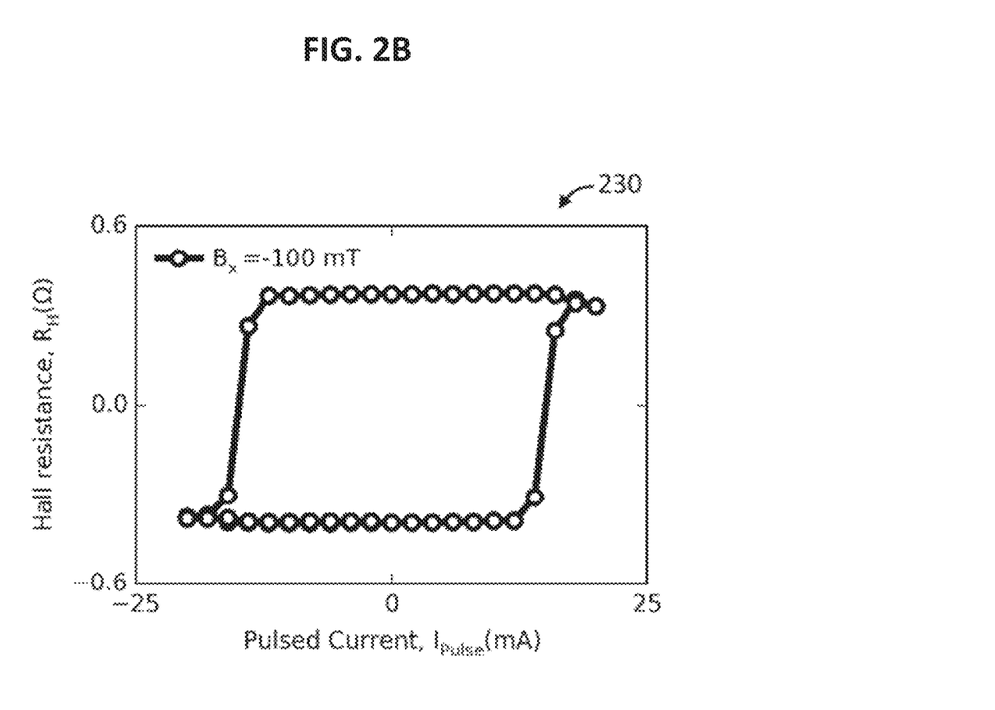
FIG. 2B is a plot of pulsed current ($I_{pulse}$) verses Hall resistance ($R_H$) for the example test structure of FIG. 2A showing current-induced perpendicular magnetization switching.

FIG. 2A is a diagram 200 of an example structure composed of a $L1_0$-ordered FePt alloy layer (e.g., 8 nm) 210 patterned into a Hall bar upon a $SrTiO_3$ substrate 220. In this example, measurements are conducted in the presence of a longitudinal field with $B_x$=−100 mT. FIG. 2B is a plot 230 of pulsed current ($I_{pulse}$) verses Hall resistance ($R_H$) for the example structure of FIG. 2A. This shows the current-induced perpendicular magnetization switching of a single magnetic layer.

Figure 3:
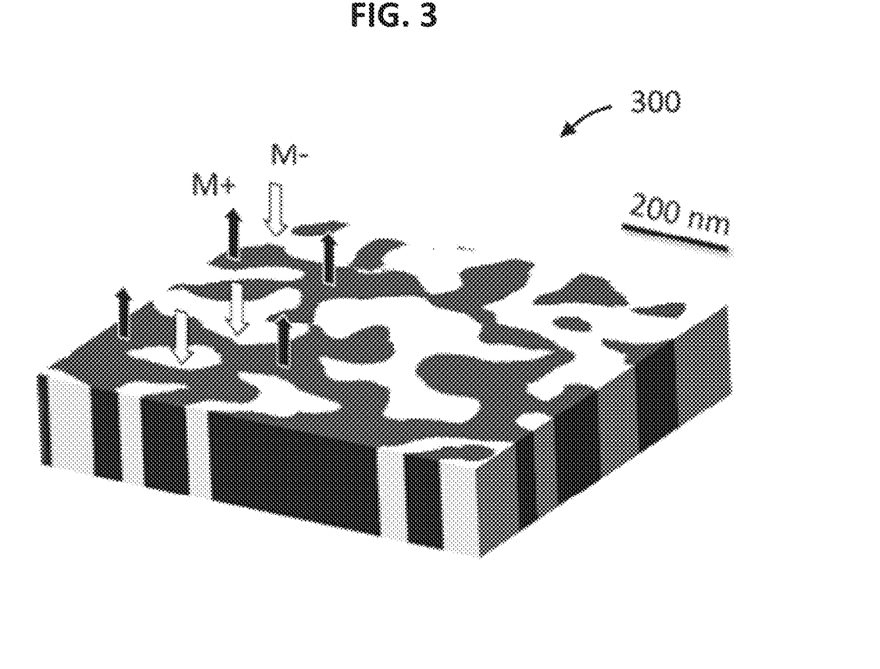
FIG. 3 is a pictorial illustration of a multi domain structure in an example $L1_0$-ordered FePt alloy layer (e.g., 8 nm)

FIG. 3 is a pictorial illustration 300 of a multi domain structure in an example $L1_0$-ordered FePt alloy layer (e.g., 8 nm). The arrows indicate the magnetization direction of local moment. By measuring the magnetic forced microscopy (MFM) of the FePt alloy layer at its demagnetization state, a domain size of around 100 nm is observed. This size, 100 nm, defines the boundary of two applications of FePt. For a SOT-MRAM application, the storage unit cell should scale down below 20 nm, which favors a single domain. Thus, only two magnetization states are expected in the FePt layer. After fabricating into magnetic tunnel junctions (MTJs), the magnetization direction of FePt can be parallel or anti-parallel to that of a pinned layer, realizing two resistance states by measuring the tunneling magnetoresistance (TMR).

For a "spin memristor" application, the cell size can be larger than 200 nm, so that the current induced SOT can partially switch the magnetization. By carefully controlling the magnitude and pulse width of the current, a continuous changing of total magnetization M can be attained, realizing multi-level resistance states by reading the Hall resistance of a Hall device.

Figure 4:
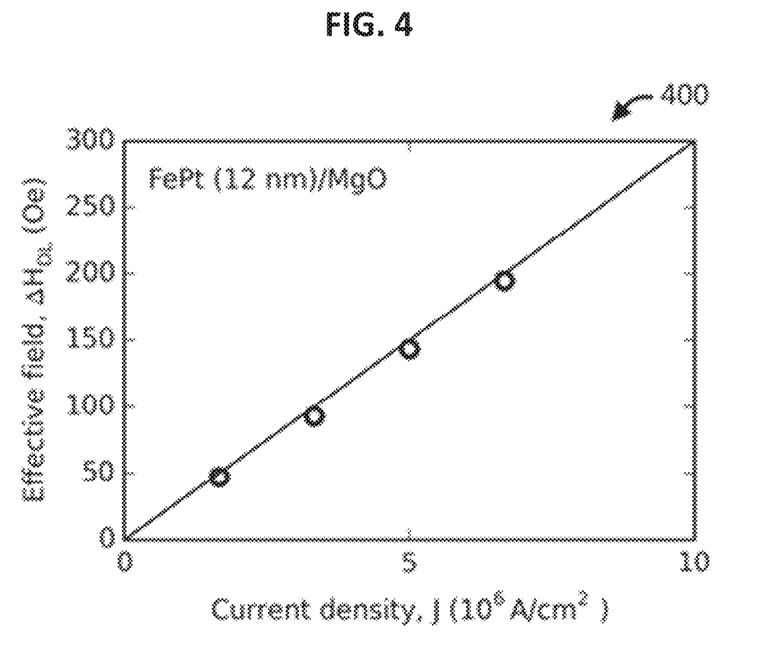
FIG. 4 is a plot of spin torque effective field ($\Delta H_{AD}$) verses current density of a $L1_0$-ordered FePt (e.g., 12 nm) on MgO substrate.

FIG. 4 is a plot of spin torque effective field ($\Delta H_{AD}$) verses current density of a $L1_0$-ordered FePt (e.g, 12 nm) on MgO substrate. To compare with the previous HM/FM bilayers, we calculate the spin torque efficiency ($\beta_{SL}$)

responsible for switching of FePt single-layer, which is defined as $H_{SL}/J_e$. Surprisingly, $\beta_{SL}$ is 300 Oe/($10^7$ A/cm$^2$), which are several times higher than that in Pt/FM bilayers. Furthermore, the spin torque efficiency can be tuned by the film thickness and the tensile strain from the substrates (MgO or SrTiO$_3$).

For a current-assisted magnetic recording application, current induced SOT in L1$_0$-ordered alloy nanoparticles may assist field switching of magnetization direction in a nanoparticle. The field switching of the magnetization of nanoparticle in HAMR media is achieved by using a small laser to heat the part of the disk that is being written to. Current induced SOT can effectively decrease the switching field while avoiding the heating, which is harmful to the media. In order to avoid the Joule heating in SOT switching, a short current pulse (e.g., <1 us) may be utilized.

SOT-MRAM

In a first embodiment, current induced SOT in a L1$_0$-ordered alloy may be employed in a SOT-MRAM to change magnetization direction. A L1$_0$-ordered alloy (e.g., L1$_0$-ordered FePt) may be capable of ultrahigh magnetic information storage due to its high magnetocrystalline anisotropy and excellent thermal stability.

Figure 5:
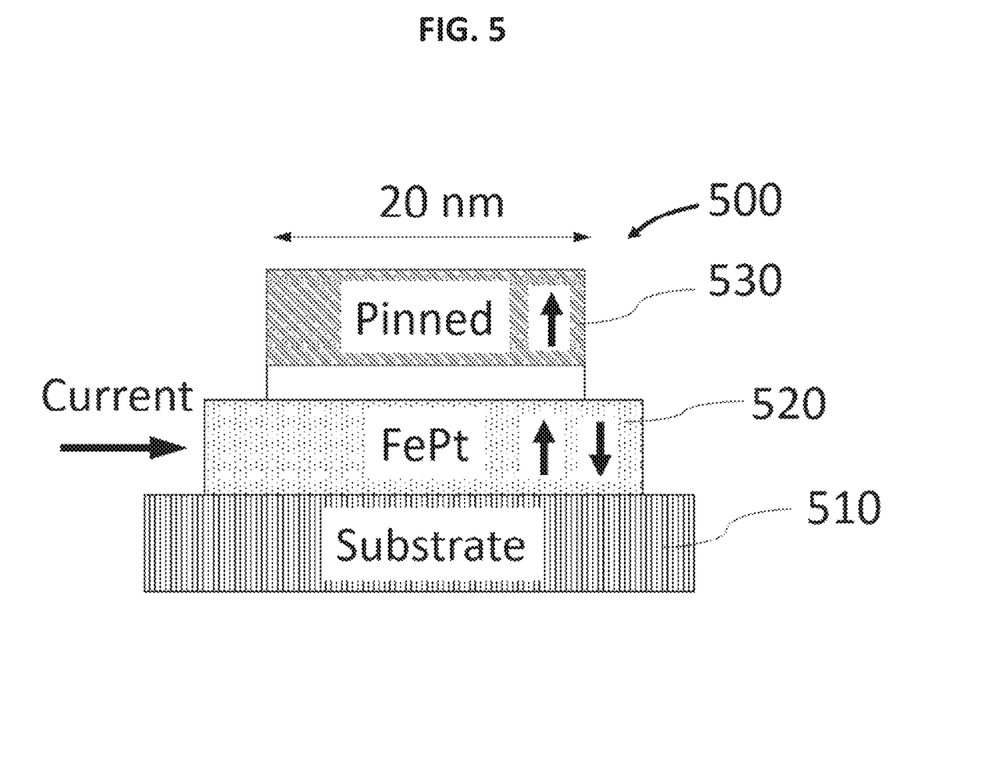
FIG. 5 is a diagram of an example MTJ element of a $L1_0$-ordered alloy based SOT MRAM.

FIG. 5 is a diagram 500 of an example MTJ element of a L1$_0$-ordered alloy based SOT-MRAM. The MTJ element includes a single crystal substrate 510, in this example, STO. A layer of L1$_0$-ordered alloy 520, in this example FePt, is deposited upon the substrate. To provide high SOT efficiency, the L1$_0$-ordered alloy 520 may be grown as a high quality L1$_0$-ordered FePt (001) epitaxial thin film. A pinned layer 530 may be deposited thereon. By applying a large enough in-plane DC current pulse (for example 10 mA pulse amplitude), induced SOT can switch the magnetization of the L1$_0$-ordered alloy 520 in the presence of an external magnetic field. However, in many applications, the use of an external magnetic field is not desirable, since it may not be well controllable in nm-sized areas and may require a complicated structure to produce. As such, in commercial implementations, an AFM layer (e.g., an IrMn or PtMn layer) (not shown) may be deposited adjacent to the L1$_0$-ordered magnetic alloy layer 520, which may then be biased through antiferromagnetic exchange coupling during thin film growth to permit magnetization switching absent the presence of an external magnetic field.

In the example MTJ element of a L1$_0$-ordered alloy based SOT-MRAM of FIG. 5, tunneling magnetoresistance may be measured to track binary states. Compared with a traditional Pt/CoFeB based MTJ, a L1$_0$-ordered alloy (e.g., L1$_0$-ordered FePt) based MTJ may possess higher spin torque efficiency. L1$_0$-ordered FePt is tetragonal in symmetry and is atomically ordered. There is no spin transfer at the interface allowing higher spin torque efficiency. Further, compared with a traditional Pt/CoFeB based MTJ, a L1$_0$-ordered alloy (e.g., L1$_0$-ordered FePt) based MTJ may require a much smaller DC current density for switching. This may protect the L1$_0$-ordered magnetic alloy layer from Joule heating. Likewise, compared with a traditional Pt/CoFeB based MTJ, a L1$_0$-ordered alloy (e.g., L1$_0$-ordered FePt) based MTJ may offer higher thermal stability. For example, bulk-PMA in L1$_0$-ordered FePt is strong enough to preserve thermal stability when the device size is below 20 nm. Still further, compared with a traditional Pt/CoFeB based MTJ, a L1$_0$-ordered alloy (e.g., L1$_0$-ordered FePt) based MTJ may require less fabrication processes. For example, a single L1$_0$-ordered FePt layer may be used to replace a HM/FM bilayer.

Spin Memristor

Figure 6:
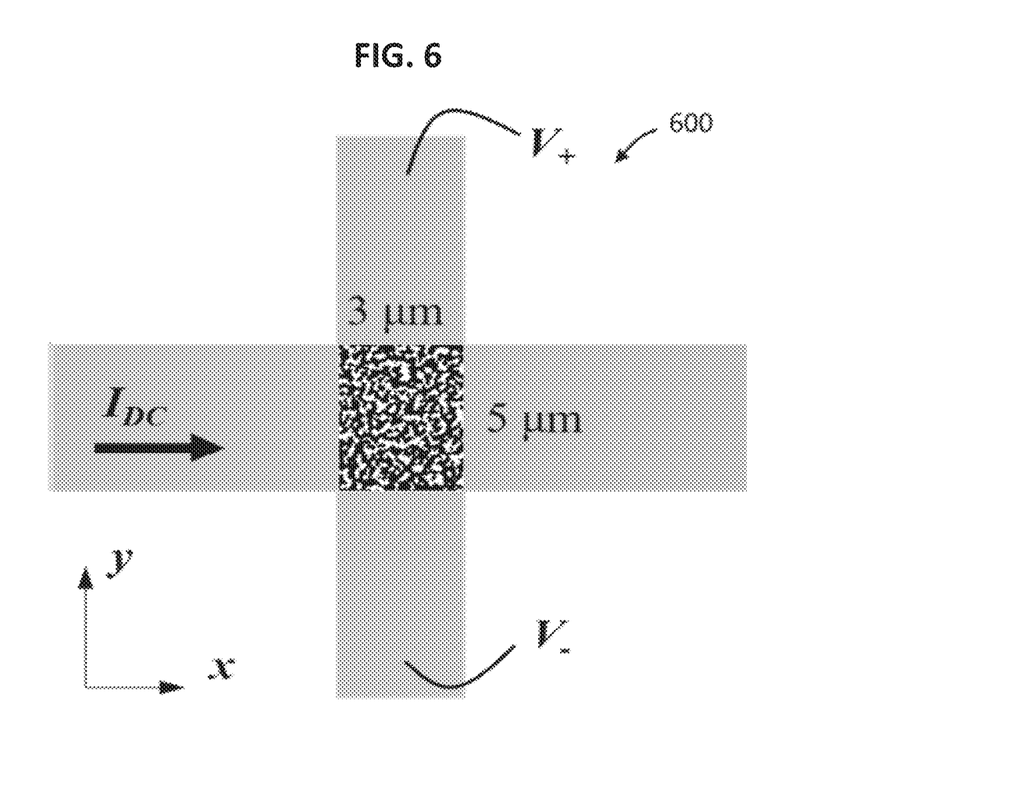
FIG. 6 is a diagram of an example $L1_0$-ordered alloy Hall bar that may function as a "spin memristor"

In a second embodiment, current induced SOT in a L1$_0$-ordered magnetic alloy layer may be used to achieve "spin memristor" like behavior. The L1$_0$-ordered magnetic alloy layer may be deposited on a single crystal substrate, such as a SrTiO$_3$, MgO, LaAlO$_3$, KTaO$_3$, or glass and Si substrate to achieve PMA FIG. 6 is a diagram 600 of an example L1$_0$-ordered alloy Hall bar that may function as a "spin memristor". In this example, a Hall bar is fabricated from micro strips of L1$_0$-ordered FePt having a crossing area 610 is 5 μm×3 μm. A multi-domain structure is formed in the micro sized Hall bar since, as described above, the domain period of L1$_0$ ordered FePt is about 50-200 nm. In the crossing area, a multiple domain state is formed after a demagnetization process. The ratio between upward magnetization areas and downward magnetization areas can be continuously tuned through current induced SOT switching, which realizes multi-level Hall resistance states.

Figure 7:
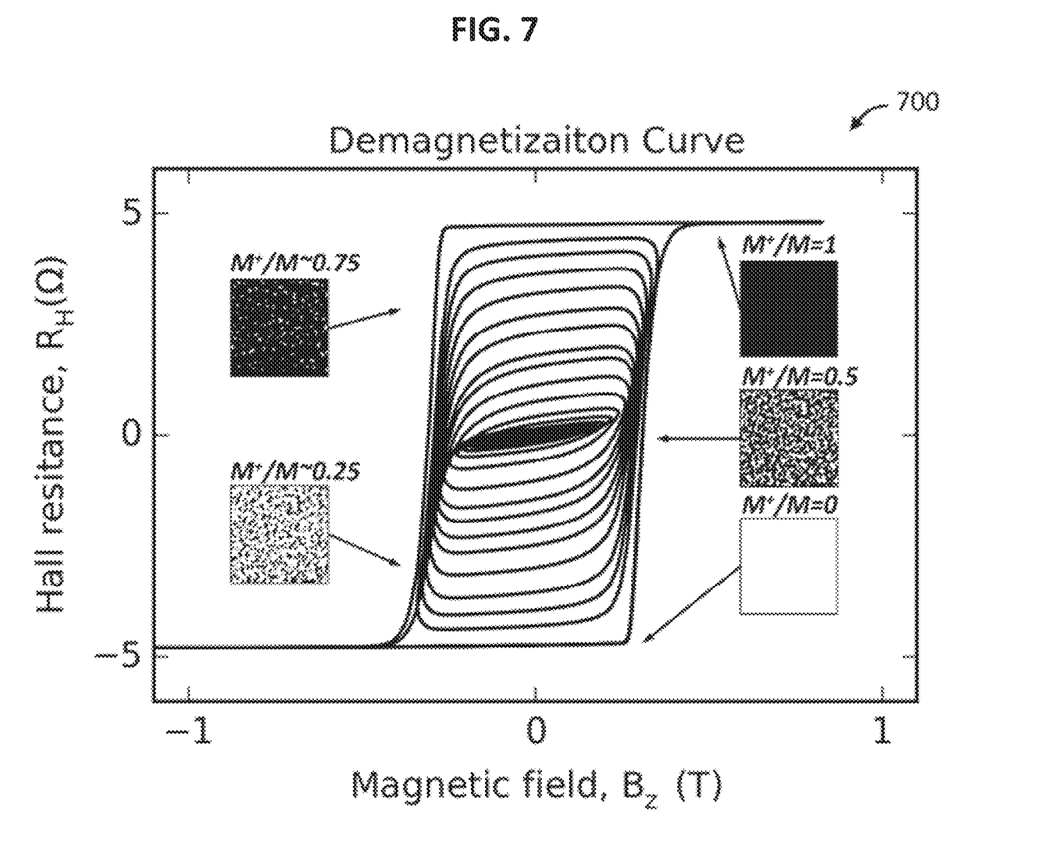
FIG. 7 is an example demagnetization curve with decaying oscillating magnetic field for the example $L1_0$-ordered alloy Hall bar of FIG. 6.

FIG. 7 is an example demagnetization curve 700 with decaying oscillating magnetic field for the example L1$_0$-ordered alloy Hall bar of FIG. 6. In the demagnetization procedure, one may apply an oscillating magnetic field B$_z$ and gradually decrease the amplitude. As depicted, the remanence gradually decreases to zero, forming stable intermediate states (as shown in the middle inset). This is due to the decrease of upward magnetization ratio (M$^+$/M). At the final state, the ratio equals 0.5, giving a typical demagnetized state of FePt.

Figure 8:
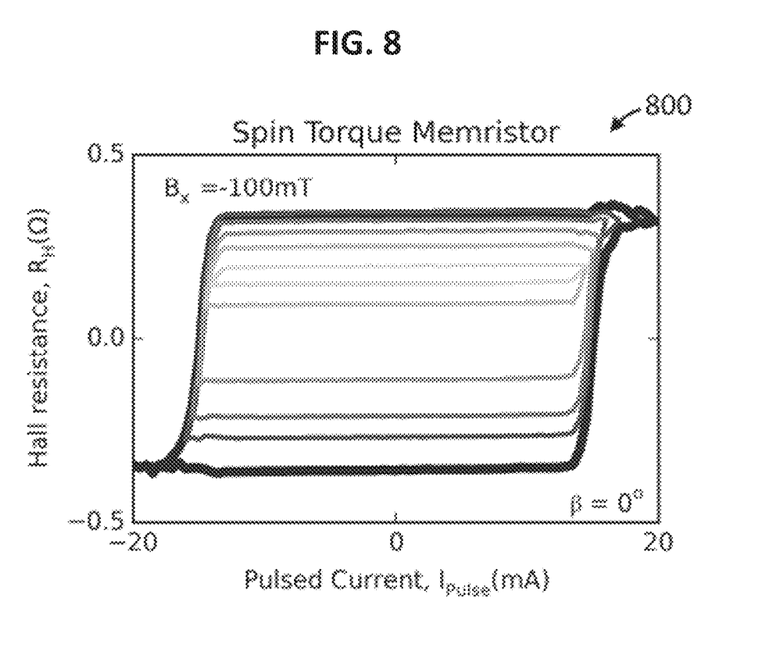
FIG. 8 is a diagram of Hall resistance $R_H$ vs. pulsed current $I_{pulse}$ in the example $L1_0$-ordered alloy Hall bar of FIG. 6, showing a "memristor" like behavior by controlling the amplitude of applied current.

While a multi-domain structure in micro sized L1$_0$-ordered alloy Hall bar may not be well suited for use in MRAM because of the large size, it may well serve as a spin mersister. "Spin memristors" have applications in artificial neural networks among other uses. When an in-plane current is applied in the presence of an in-plane magnetic field, current induced SOT can gradually switch the magnetic domains in a crossing area 620. FIG. 8 is a diagram 800 of Hall resistance R$_H$ vs. pulsed current I$_{pulse}$ in the example L1$_0$-ordered alloy Hall bar of FIG. 6, showing a "memristor" like behavior by controlling the amplitude of applied current. In this example, an −100 mT external magnetic field B$_x$ is applied to break the torque symmetry. The switching ratio of the magnetization (measured as Hall resistance) is well determined by the current amplitude. The black lines in FIG. 8 indicate larger switching ratio with larger current, while the grey lines indicates lower switching ratio with lower current.

While the above example utilizes an −100 mT external magnetic field, the field requirements may be decreased by using other L1$_0$-ordered alloys (CoPt, FePd, etc.) with lower M$_s$ and K$_u$. The external field also can be replaced through exchanging bias of an anitiferromagnetic layer (e.g., an IrMn or PtMn layer) added adjacent to the L1$_0$-ordered magnetic alloy layer. While a four-terminal μm-sized Hall-device is shown in FIG. 6, it should be understood that the same principle may be applied to nm-sized (e.g., >200 nm) MTJs, which may be better suited for commercial devices.

Compared to traditional memristor designs that employ an AFM/FM bilayer (e.g., PtMn/[CoNi]$_N$ bilayer), a L1$_0$-ordered magnetic alloy layer based memristor may provide a more controllable domain structure. For example, a L1$_0$-ordered FePt micro sized Hall bar exhibits a stable multi-domain property, which is closely connected to its microstructural features, while for an AFM/FM bilayer the magnetic domain distribution depends on the exchange bias direction. Further, compared to traditional memristor designs that employ an AFM/FM (e.g., PtMn/[CoNi]$_N$ bilayer), a $L1_0$-ordered alloy magnetic layer based memristor may require less fabrication processes.

Current-Assisted Magnetic Recording

In a third embodiment, current-assisted magnetic recording may utilize current induced SOT in $L1_0$-ordered alloy nanoparticles to assist field switching of magnetization direction.

The magnetization of a $L1_0$-ordered alloy (e.g., $L1_0$-ordered FePt) nanoparticle can be locally switched with a small magnetic field with a thermal assist from a laser. The thermal effect is used to overcome the high coercivity so that it can effectively lower the switching field. A similar effect may be achieved with current induced SOT. In a magnetic recording application, $L1_0$-ordered alloy (e.g., $L1_0$-ordered FePt) nanoparticles may be separated each other to avoid their coupling. In order to apply an in-plane current, a conductive buffer layer such as TiN may be used.

Figure 9:
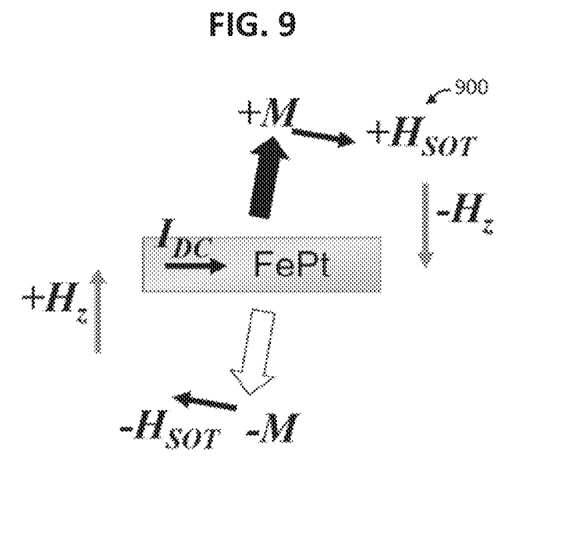
FIG. 9 is a diagram showing example effective fields acting on the moment in $L1_0$-ordered FePt, which has application in current-assisted magnetic recording.

FIG. 9 is a diagram 900 showing example effective fields acting on the moment in $L1_0$-ordered FePt. As shown, the current induced SOT effective field ($H_{SOT}$) takes the form M×Y, where M is the magnetization and Y is the unit vector along Y axis. $H_{SOT}$ depends on the magnetization polarity for fixed in-plane current, and can assist the applied magnetic field ($H_z$) to switch M. Specifically, for upward magnetization (+M), the current induced effective field (+$H_{SOT}$) acts together with the negative magnetic field (−$H_z$) to effectively lower the effective field. For downward magnetization (−M), the current induced effective field (−$H_{SOT}$) acts together with the positive magnetic field (+$H_z$) to effectively lower the effective field.

Compared to traditional HAMR, where a laser is used to heat nanoparticles to temperature near Curie temperature ($T_c$), causing magnetization to be unstable, the SOT induces an effective field and the generated Joule heating can be decreased by shortening the current pulse width.

Concluding Comments and Alternatives

In $L1_0$-ordered alloy, due to strong spin orbit coupling, a nonequilibrium spin accumulation is generated to exert a torque on the magnetic moments to realize perpendicular magnetization switching. A multi-domain property in a micro sized $L1_0$-ordered alloy Hall bar may allow formation of multi-level Hall resistance states through current induced partial magnetization switching, which can be used to realize the memristor-like behavior. Compared with a traditional SHM/MM bilayer (e.g., Pt/CoFeB), a $L1_0$-ordered alloy single layer avoids the interface spin current transfer, allowing it to possess a much higher spin torque efficiency. Further, bulk-PMA may be strong enough to preserve thermal stability when the device size decreases below 20 nm.

It should be appreciated that details included in the various example embodiments presented above are merely provided for purposes of illustration, and are not intended to limit the scope, applicability, or configuration of the invention. For example, while FePt is used in many of the examples above as the $L1_0$-ordered alloy, it should be remembered that similar structures may alternatively be utilized that provide spin orbit coupling and $L1_0$-order. For example, $L1_0$-ordered FePt (including FePt doped with Mn), CoPt (including CoPt doped with Cr), FePd and other $L1_0$-ordered alloy as well as other atomically layered structures with the combination of heavy atoms (e.g., Pt, Pd, etc.) and ferromagnetic atoms (e.g., Fe, Co, etc.) may be utilized. Materials with smaller $M_s$ and $K_u$ may be chosen to realize more effective switching by current induced SOT. It should also be remembered that a variety of different substrates may be used, including $SrTiO_3$, MgO, $LaAlO_3$, $KTaO_3$, Si and glass with a buffer layer such as CrRu/TiN or CrRu/MgO, Pt or their combination. In general, it should be understood that the various components in the example embodiments presented above may be made from differing materials, implemented in different combinations or otherwise formed or used differently without departing from the intended scope of the invention.

What is claimed is:

1. A spin-orbit torque (SOT) device comprising:
   a substrate defining a plane; and
   an $L1_0$-ordered magnetic alloy layer parallel to the substrate, the $L1_0$-ordered magnetic alloy layer having a perpendicular magnetization direction that is switchable via SOT in response to application of an in-plane current to the SOT device in the absence of spin current from an adjacent spin Hall material (SHM) layer.

2. The SOT device of claim 1, wherein the $L1_0$-ordered magnetic alloy layer comprises iron-platinum (FePt) alloy, cobalt-platinum (CoPt) alloy or iron-palladium (FePd) alloy.

3. The SOT device of claim 1, wherein the SOT device is a SOT-magnetic random access memory (MRAM).

4. The SOT device of claim 3, further comprising:
   a pinned layer,
   wherein the perpendicular magnetization direction is parallel or anti-parallel to a magnetization direction of the pinned layer.

5. The SOT device of claim 3, further comprising:
   a biased antiferromagnet (AFM),
   wherein the $L1_0$-ordered magnetic alloy is switchable absent the presence of an external magnetic field.

6. The SOT device of claim 1, wherein the SOT device is a spin memristor.

7. The SOT device of claim 6, wherein the perpendicular magnetization direction is switchable to tune a ratio between magnetization areas having perpendicular magnetization direction in a first direction and magnetization areas having perpendicular magnetization direction in a second direction to provide multiple Hall-resistance states.

8. The SOT device of claim 7, wherein the perpendicular magnetization direction is switchable to tune the ratio in response amplitude and/or pulse width of the in-plane current.

9. The SOT device of claim 1, wherein the SOT device is a current-assisted magnetic recording media.

10. The SOT device of claim 9, wherein the $L1_0$-ordered magnetic alloy layer comprises separated $L1_0$-ordered magnetic alloy nanoparticles, and the SOT device further comprises a conductive buffer layer.

11. The SOT device of claim 9, wherein the perpendicular magnetization direction is switchable in further response to a thermal assist from a laser.

12. A spin-orbit torque (SOT) device comprising:
   a substrate; and
   a single magnetic layer of iron-platinum (FePt) alloy, cobalt-platinum (CoPt) alloy or iron-palladium (FePd) alloy, the single magnetic layer having a magnetization direction that is switchable via SOT in response to application of a current to the SOT device in the absence of spin current from an adjacent spin Hall material (SHM) layer.

13. The SOT device of claim 12, wherein the SOT device is a SOT-magnetic random access memory (MRAM).

14. The SOT device of claim 12, wherein the SOT device is a spin memristor.

15. The SOT device of claim 12, wherein the SOT device is a current-assisted magnetic recording media.

* * * * *